United States Patent [19]

Kountz et al.

[11] Patent Number: 5,342,828

[45] Date of Patent: Aug. 30, 1994

[54] SUPERCONDUCTING TL-PB-SR-CA-CU-O THIN FILM

[75] Inventors: Dennis J. Kountz, Wilmington, Del.; Frank M. Pellicone, North East, Md.

[73] Assignee: E. I. Du Pont de Nemours and Company, Wilmington, Del.

[21] Appl. No.: 27,737

[22] Filed: Jan. 29, 1993

Related U.S. Application Data

[62] Division of Ser. No. 710,888, Jun. 6, 1991.

[51] Int. Cl.$^5$ .................................. B32B 9/00
[52] U.S. Cl. ............................. 505/238; 505/701; 505/731; 505/742; 505/783; 505/475; 428/930; 428/702; 428/697; 428/701; 427/62
[58] Field of Search .......... 505/1, 701, 731, 742, 505/783; 427/62, 63; 428/930, 701, 702, 697, 689

[56] References Cited

U.S. PATENT DOCUMENTS 4,894,361  1/1990  Subramanian ..................... 505/1

OTHER PUBLICATIONS

Subramanian, et al., *Science*, vol. 242, Oct. 1988, pp. 249–252.
Ianno, SPIE Proceedings vol. 1187 (1989), pp. 66–83.
Laubacher, et al., *IEEE Trans. Magn.*, 27(2), Mar. 1991, pp. 1418–1421.
Lee, et al., *Appl. Phys. Lett.*, 53(4), Jul. 1988, pp. 329–331.
Holstein, et al., *IEEE Trans. Magn.*, 27(2), Mar. 1991, pp. 1568–1572.
Nabatame, et al., *Jap. J. Appl. Phys.*, 29(10), Oct. 1990, pp. L1813–L1815.
Doss, et al., *Supercond. Sci. Technol.*, 2 (1989) pp. 63–65.
Portis, et al., *J. Superconductivity*, vol. 3, No. 3, 1990, pp. 297–304.
Yeshurun, et al., *Phys. Rev. Lett.*, 60(21), May 1988, pp. 2202–2205.
Flippen, et al., *J. Appl. Phys.* 67(9), May 1990, pp. 4515–4517.
Lyons, et al., *Microwave Journal*, Nov. 1990, pp. 85–102.
Withers, et al., *Solid State Technology*, Aug. 1990, pp. 83–87.
Qiu, et al., *Appl. Phys. Lett.*, 53(12), Sep. 1988, pp. 1122–1124.
Shah, et al., *Appl. Phys. Lett.*, 56(8), Feb. 1990, pp. 782–784.
Takano, et al., *Appl. Phys. Lett.*, 55(8), Aug. 1989, pp. 798–800.
Hammond, et al., *Appl. Phys. Lett.* 57(8), Aug. 1989, pp. 825–827.
Lin, et al., *Jap. J. Appl. Phys.* 28(1), Jan. 1989, pp. L85–L87.

*Primary Examiner*—Roy V. King

[57] ABSTRACT

A superconducting Tl—Pb—Sr—Ca—Cu—O thin film comprised of at least one phase of the formula $Tl_{0.5}Pb_{0.5}Sr_2Ca_{1+n}Cu_{2+n}O_{7+2n}$ where $n=0$, 1 or 2 is disclosed, which is prepared by a process comprising sputtering an oxide film onto a dielectric substrate from an oxide target containing preselected amounts of Tl, Pb, Sr, Ca and Cu, and heating an oxygen-containing atmosphere in the deposited film in the presence of a source of thallium oxide and lead oxide and cooling the film.

3 Claims, No Drawings

SUPERCONDUCTING TL-PB-SR-CA-CU-O THIN FILM

This is a division of application Ser. No. 07/710,888, filed Jun. 6, 1991.

BACKGROUND OF THE INVENTION

1. Field of the Invention

This invention relates to a process for making films of Tl—Pb—Sr—Ca—Cu—O compositions which are superconducting. The invention also relates to a method for fabricating microwave and other electronic devices from these films.

2. Background

Recent advances in the elevation of superconducting transition temperature of various oxide materials have provided the opportunity for applications of such materials in radiofrequency, microwave and other electronic technologies. Considerable progress has been made in a number of fabrication technologies related to forming these oxide superconductors into various electronic devices. The higher the transition temperature of the superconducting oxide, the more likely that material will be of value in such applications. Subramanian, U.S. Pat. No. 4,894,361, and Subramanian et al., Science 242, 249 (1988) disclose superconducting compositions of Tl—Pb—Sr—Ca—Cu—O. Two superconducting phases, one with a c-axis unit cell dimension of about 12 Angstroms (1.2 nm) and a superconductivity transition temperature ($T_c$) of about 85 K, and one with a c-axis unit cell dimension of about 15 Angstroms (1.5 nm) and a $T_c$ of about 122 K, were identified. Methods for producing powders of these materials and single crystals of the higher $T_c$ material are also disclosed.

For most present electronic device applications, such as radiofrequency and microwave technology, thin films are proving to be the most useful form of superconducting oxide. Various methods of producing superconducting films from oxides materials have been described. See, for example, Venkatesan, SPIE Proceedings Vol. 1187 (1989). These methods can be described as either in-situ or ex-situ fabrication routes, depending on whether the superconducting oxide film is made during a single-step process encompassing deposition, reaction and crystalline growth of the desired superconducting phases or by a two step process involving the deposition of a precursor, followed by a second distinct reaction and crystalline growth step. The second distinct step has generally been described as annealing. See, for example, Laubacher et al., IEEE Trans. Magn., MAG-27, 1418, (1991).

In the case of yttrium barium copper oxide films this second step has generally involved the reaction of the yttrium, barium, copper and oxygen components above the orthorhombic to tetragonal phase transition temperature followed by further reaction of the nonsuperconducting tetragonal phase with oxygen near the phase transition temperature to form the superconducting orthorhombic phase. In-situ methods have also been developed for forming yttrium barium copper oxide films. These processes have generally involved either laser ablation or sputtering deposition in the presence of an oxygen atmosphere while raising the temperature of the substrates and the films being deposited to a temperature favoring reaction and crystalline growth of the superconducting oxide film.

In the case of other superconducting oxides such as the Tl—Ba—Ca—Cu—O materials, only ex-situ processes have been reported to be successful. Films consisting of Tl and/or Ba—Ca—Cu—O have been deposited, and the resulting films have been annealed in containers containing the volatile thallium oxide at an elevated temperature which favors the growth of the desired superconducting oxide phase. See, for example, Lee et al., Appl. Phys. Lett. 53, 329 (1988), Holstein et al., IEEE Trans. Magn., MAG-27, 1568, (1991), and Nabatame et al. Jap. J. Appl. Phys. 29, L1813 (1990).

Improved superconductor oxide film properties are necessary for the integration of these materials into electronic devices. Measurements of electrical transport properties and magnetic measurements on fabricated forms of superconducting oxides provide an estimate of their performance in electronic devices. An eddy-current measurement technique described by Doss et al., Supercond. Sci. Technol. 2, 63 (1989), has proven to be useful in evaluating superconducting films. Radiofrequency and microwave cavity resonator measurements provide an estimate of a superconductor oxide film performance for various passive and active devices as described in Portis et al. J. Superconductivity 3, 297 (1990). From measurements of X", the complex part of the ac susceptibility, of a superconducting oxide a relationship of magnetic flux lattice pinning with respect to temperature can be derived which is called an irreversibility line. See, for example, Y. Yeshurun and A. P. Malozemoff, Phys. Ref. Lett. 60, 2202 (1988) and R. B. Flippen and T. R. Askew, J. Appl. Phys. 67, 4515 (1990). The X" peak is the value of maximum adsorption of energy by the flux lattice. These X" peak values define the irreversibility line which is the boundary between the magnetic flux-pinned and flux-mobile regions in a superconductor exposed to an external magnetic field. For magnetic fields higher than that of the irreversibility line, magnetic flux is mobile in the superconductor and the critical current is zero. For magnetic fields lower than that of the irreversibility line, magnetic flux is pinned and a superconducting current can exist.

Various electronic devices fabricated from superconducting oxides have been reported. Problems with high contact resistance between metal and superconductor interfaces, poor superconducting surface properties, uncontrolled reactivity of superconducting oxide surfaces with conventional photolithographic chemicals and incompatibility with conventional lithographic techniques have limited the fabrication and performance of electronic devices produced from superconducting oxide materials. Some progress has been made on passive microwave device fabrication and performance using superconducting oxide films. See, for example, Lyons and Withers, Microwave Journal, 33, 85,(1990) and Withers et al., Solid State Technology, 33, 83, (1990).

SUMMARY OF THE INVENTION

This invention provides a process for making a superconducting Tl—Pb—Sr—Ca—Cu—O thin film comprising a phase of the formula $Tl_{0.5}Pb_{0.5}Sr_2Ca_{1+n}Cu_{2+n}O_{7+2n}$ where n=0, 1 or 2. The process comprises (a) sputtering an oxide film onto a dielectric substrate from a target formed by (1) heating a mixture of Tl, Pb, St, Ca and Cu oxides wherein the atomic ratio of Tl:Pb:Sr:Ca:Cu is a:b:c:d:e, wherein a is from 0 to about 1, b is from 0 to about 1, c is from about 2 to about 3.4, d is from about 1 to about 4 and e is from about 2 to about 5, and (2) compressing and heating said mixture, (b) placing the substrate having said sputtered oxide film thereon and a source of thallium oxide and lead oxide in an inert container with an oxygen-containing atmosphere, with the amount of thallium and lead contained in the source being at least 100 times the amount of thallium and lead necessary to convert the film to $Tl_{0.5}Pb_{0.5}Sr_2Ca_{1+n}Cu_{2+n}O_{7+2n}$, (c) heating said container and its contents, i.e., the film produced in (a) and the source of thallium oxide and lead oxide, to a temperature of from about 850° C. to about 950° C. and maintaining this temperature for at least about 10 minutes, and (d) cooling said container and its contents and recovering the superconducting Tl—Pb—Sr—Ca—Cu—O thin film.

Preferably, the sputtering oxide target has an atomic ratio of Pb:Sr:Ca:Cu of 0.5:2:2:3 and rf magnetron sputtering is used. Low temperature deposition with the formation of a predominantly amorphous film is preferred.

Preferably, the source of thallium oxide and lead oxide is comprised of $Tl_{0.5}P_{0.5}Sr_2Ca_2Cu_3O_9$ and $Tl_2O_3$.

DETAILED DESCRIPTION OF THE INVENTION

Superconducting Tl—Pb—Sr—Ca—Cu—O thin films useful for fabricating microwave and other electronic devices can be prepared by the present process. These films are comprised of at least one phase of the formula $Tl_{0.5}Pb_{0.5}Sr_2Ca_{1+n}Cu_{2+n}O_{7+2n}$ where n=0, 1 or 2. There can be some deviation of the atomic ratio of Tl:Pb from 1:1 and the other atomic ratios indicated by the formulas given above and the resulting films will still exhibit good superconducting properties. Films with the the atomic ratio of Tl:Pb of 1:1 have the highest $T_c$. Despite any deviation from the 1:1 ratio, the sum of Tl and Pb per formula unit is about 1. For the purposes herein, films having such variations from the ideal stoichiometries of the formulas are to be encompassed by the above formulas. Similarly, there can be deviations from the atomic ratio of Tl:Pb:Sr:Ca:Cu of a:b:c:d:e in the oxide target used for sputtering and such targets can be used to provide oxide films which are essentially equivalent to those obtained from targets with the exact ratios. Targets having such variations from the given ratios are taken to be encompassed by the nominal ratios.

For brevity, the superconducting phase with n=0, c-axis unit cell dimension of about 12 Angstroms (1.2 nm) and a maximum $T_c$ of about 85 K will be referred to as 1212. The superconducting phase with n=1, c-axis unit cell dimension of about 15 Angstroms (1.5 nm) and a maximum $T_c$ of about 125 K will be referred to as 1223. The superconducting phase with n=2 and c-axis unit cell dimension of about 18 Angstroms (1.8 nm) will be referred to as 1234.

Deposition of an oxide film of Sr—Ca—Cu, Pb—Sr—Ca—Cu or Tl—Pb—Sr—Ca—Cu can be produced by various physical and chemical methods with sputtering being preferred. DC magnetron and rf magnetron sputtering can be used, but rf magnetron sputtering is preferred. Also preferred is the use of off-axis sputtering, i.e., the films are deposited on substrates which are located away from the axis normal to the sputtering target surface so that the substrates and resulting films no longer lie directly parallel to the sputtering target during deposition. This minimizes resputtering of the film surface. The sputtering target is an oxide ceramic composition containing copper, calcium, strontium or copper, calcium, strontium, and thallium and/or lead, i.e. the oxide target contains an atomic ratio of Tl:Pb:Sr:Ca:Cu of a:b:c:d:e, wherein a is from 0 to about 1, b is from 0 to about 1, c is from about 2 to about 3.4, d is from about 1 to about 4 and e is from about 2 to about 5. A sputtering target composition with a equal to zero, b about ½, c about 2, d about 2 and e about 3 is preferred. Typically, the sputtered film is about 500 to about 50,000 angstroms (50–5000 nm) thick.

The sputtering target can be prepared by mixing oxides of thallium, lead, strontium, calcium, and copper in quantities such that the atomic ratio of Tl:Pb:Sr:Ca:Cu has the desired ratio of a:b:c:d:e. For example, a target containing no thallium and with an atomic ratio of Pb:Sr:Ca:Cu of 0.5:2:2:3 is made taking 16.7 grams of PbO, 31.0 grams of SrO, 16.7 grams of CaO and 35.6 grams of CuO, and shaking these oxides together in a sealed container. The powders are then ground in a mortar and pestle and placed in an alumina crucible and heated to 800° C. for 6 hours in air. The sintered powders are then ground in a mortar and pestle and pressed in a die at a pressure of about 30 tons per square inch at a temperature of 400° C. for one hour.

Sputtered films can be deposited over a range of temperatures and the deposited films will have a range of crystallinities and chemical compositions depending on the deposition temperature. Low temperature deposition results in the formation of a predominantly amphorous film and this is preferred. The substrate can be a metal or a ceramic material. A ceramic with a low dielectric constant and a low loss-tangent is preferred. Examples of such materials are lanthanum aluminate—$LaAlO_3$, neodynium gallate—$NdGaO_3$, lanthanum gallate—$LaGaO_3$, magnesium oxide—MgO and yttrium stabilized zirconia—YSZ. Other ceramic substrates such as strontium titanate, $SrTiO_3$, can be used.

The sputtered film is then annealed. The substrate on which the film has been deposited is placed in a container made of an inert material such as alumina or gold. A source of thallium oxide and lead oxide is also placed in the container. A convenient arrangement is to place this source in the bottom of the container and to place the substrate on which the film has been deposited onto a screen made of an inert material with the screen suspended over the thallium-and lead-containing source. The source of thallium oxide and lead oxide can be in the form of powder and/or pellets comprised of one or more of (i) the single phase composition of the formula $Tl_{0.5}Pb_{0.5}Sr_2Ca_{1+n}Cu_{2+n}O_{7+2n}$ wherein n is 0 or 1, (ii) the nominal composition $Tl_aPb_bSr_cCa_dCu_e$ wherein a is from 0 to about 1, b is from 0 to about 1, c is from about 2 to about 3.4, d is from about 1 to about 4 and e is from about 2 to about 5, (iii) a mixture of oxides of thallium and lead, i.e., $Tl_2O_3$ and/or $Tl_2O$ and one or more lead oxides selected from the group consisting of $PbO_2$, PbO, $Pb_2O_3$, and $Pb_3O_4$, and (iv) the single phase composition of (i) or the nominal composition of (ii) supplemented by an oxide of thallium or lead chosen from those listed in (iii). A preferred source of thallium oxide and lead oxide is a powder mixture of $Tl_{0.5}Pb_{0.5}Sr_2Ca_2Cu_3O_9$ and $Tl_2O_3$ in approximately equal amounts by weight. The amount of thallium and lead contained in the source should be at least 100 times the amount of thallium and lead necessary to convert the film to $Tl_{0.5}Pb_{0.5}Sr_2Ca_{1+n}Cu_{2+n}O_{7+2n}$.

Preferably a cover of an inert material is placed on the container. The container can also be sealed. The atmosphere enclosed within a covered or sealed container is preferably oxygen-containing, e.g., air.

The film is then annealed by heating the container and its contents to a temperature of from about 850° C. to about 950° C. and maintaining this temperature for at least about 10 minutes. Annealing times of 32 hours or more can be used. Following this heating, the container and its contents are cooled and the superconducting Tl—Pb—Sr—Ca—Cu—O thin film is recovered.

For an oxide film deposited onto a lanthanum aluminate substrate, it is preferred to use an alumina crucible covered with gold foil and an alumina lid, an annealing temperature of about 865° C. and an annealing time of about 16 hours.

Since thallium oxide and to a lesser degree lead oxide are volatile in the range of the annealing temperatures, it is necessary to anneal the film in an atmosphere containing oxygen and volatile thallium- and lead-containing materials. This can be achieved by the process described above. The annealing atmosphere can also contain nitrogen, argon, and water vapor. Alternatively, a film could be annealed while being deposited. The necessary amount of lead and thallium can be incorporated into the film during the deposition step and the superconducting oxide film can be grown insitu. The volatile components can be supplied by a source of thallium and lead containing compounds placed in the crucible with the films during a second annealing step or by a combination of these two methods.

Oxygen may be supplied from an external source directly as a gas or may be supplied by the decomposition of various constituent metal oxides at elevated temperatures. For example, $Tl_2O_3$ will decompose into $Tl_2O$ and $O_2$ in the preferred range of annealing temperatures. In a closed system such as a sealed crucible the oxygen pressure can be controlled by choice of the relative amounts of constituent metal oxides used. For example, instead of using pure $Tl_2O_3$ a combination of $Tl_2O_3$ and $Tl_2O$ may be used to control the oxygen pressure.

A multizone furnace could be used for annealing a film by having the film at a controlled temperature and exposed to a flowing gas containing oxygen, thallium and lead compounds which provide the appropriate vapor. The source of the thallium and lead oxides would be placed in the furnace at positions having temperatures at which the compounds would decompose and the evolving vapor would be transported by a carrier gas to the film. The vapor can be decomposed from various organic and inorganic thallium and lead containing compounds to yield the appropriate vapor composition. It is necessary that sufficient amounts of oxygen, thallium and lead be available for diffusion into the film and reaction with other constituents, and that sufficient oxygen, thallium oxide and lead oxide vapor pressure be maintained around the film during crystalline growth of the film.

Three superconducting phases have been identified in the films prepared by the process of this invention. As determined from X-ray diffraction results indexed on a tetragonal cell, one phase has a c-axis unit cell dimension of about 12 Angstroms (1.2 nm) and is the 1212 phase, a second phase has a c-axis unit cell dimension of about 15 Angstroms (1.5 nm) and is the 1223 phase and a third phase has a c-axis unit cell dimension of about 18 Angstroms (1.8 nm) and is the 1234 phase. A film produced by this process is highly c-axis oriented with the c-axis perpendicular to the surface of the substrate. The a-axis is also highly oriented in the plane of the surface of a substrate in which the lattice parameters closely match those of the superconducting phases.

The size of grains in the film can be controlled and varied from less than 10 $\mu$m to over 100 $\mu$m by selection of the substrate material, the annealing temperature, the annealing time and the amount of thallium oxide present during the annealing process. For example, larger grains can be grown on $LaAlO_3$ substrates than on $NdGaO_3$ substrates. The lattice dimensions of $LaAlO_3$ have a closer match to the a-axes of Tl—Pb—Sr—Ca—Cu—O superconducting phases. Annealing a film below 865° C. for periods less than one hour yield grains smaller than 10 $\mu$m whereas annealing a film above 865° C. for increasingly longer periods yield grains which may exceed 100 $\mu$m. Increasing the amount of $Tl_2O_3$ used in the annealing crucible also yields larger grains. It is believed that the $Tl_2O_3$ forms a flux which encourages mass transfer to large grains. Large grains reduce the density of grain boundaries, thereby making the film more useful for devices such as Josephson junction-based devices, e.g., SQUID, superconducting quantum interference devices.

The degree of grain alignment on the films can also be controlled by selection of the substrate material, annealing temperature, annealing time and the amount of thallium oxide present during the annealing process. Alignment as evidenced by X-ray diffraction reveals that $LaAlO_3$ substrates yield much greater c-axis orientation of the Tl—Pb—Sr—Ca—Cu—O phases than MgO, particularly for the 1212 phase because of the very close lattice match. Grain alignment is greater with substrate materials with lattice parameters closer to the film a-axis parameter, about 3.80 Angstroms (0,380 nm). The degree of c-axis orientation for the 1223 phase is maximized when the anneal is performed between 865° C. and 920° C. with a maximum for the 1223 phase occurring near 885° C. on $LaAlO_3$. The highest degree of c-axis orientation is realized when the amount of $Tl_2O_3$ present in the annealing crucible is approximately 30-60% of the total weight of the crucible powder. Longer annealing periods also lead to a higher degree of c-axis orientation for all the superconducting oxide phases. For example, at 875° C. the degree of c-axis orientation is approximately five times greater after sixteen hours of annealing as that which can be achieved after thirty minutes of annealing.

The ratio of the three superconducting phases, 1212, 1223 and 1234, present in the product film can be controlled by sputtered film stoichiometry, selection of substrate material, annealing temperature, annealing time, composition of thallium oxide and lead oxide materials present during the annealing process. The relative humidity of the atmosphere during handling of preannealed films and during the annealing process also influences the proportion of different phases.

The atomic ratio of Pb:Sr:Ca:Cu in the sputtered film must be about 0.5:2:2:3 in order for the desired 1223 phase to be formed preferentially. If the lead amount is higher, the formation of calcium lead oxide is favored. If the lead amount is lower, superconducting films are obtained containing more thallium than lead. These films have lower $T_c$. If the calcium content is lower the 1212 phase is clearly favored. Large excesses of strontium and calcium or copper result in the formation of unwanted binary and tertiary metal oxides of these elements.

A LaAlO$_3$ substrate favors the formation of the 1212 phase presumably because of a closer lattice match. A NdGaO$_3$ or LaGaO$_3$ substrate discourages the formation of the 1212 phase more than the 1223 phase presumably because the lattice mismatch is greater for the 1212 phase. As a result, the proportion of the 1212 phase to the 1223 phase is greater on LaAlO$_3$ than on the NdGaO$_3$ or LaGaO$_3$. If the lattice mismatch is very large, i.e., greater than a few per cent, as for MgO and YSZ, the 1212 phase is the major phase and generally the only superconducting phase. For these substrates with greater lattice mismatch, the amount of c-axis oriented 1212 phase present is considerably less than that found on the better lattice matched substrates such as LaAlO$_3$, NdGaO$_3$, and LaGaO$_3$.

Annealing temperatures of greater than 865° C. but less than 920° C. result in the presence of the 1223 phase in the product film. Annealing temperatures of from about 850° C. to about 865° C. and from about 920° C. to about 950° C. result essentially in the absence of the 1223 phase in the product film, and the film consists essentially of the 1212 phase and other nonsuperconducting oxides.

Longer annealing periods result in much greater growth of all phases; however, the 1223 phase and especially the 1234 phase are present and grow significantly only if the annealing period exceeds about 30 minutes.

When the amount of Tl$_2$O$_3$ present in the annealing crucible is approximately 30–60% of the total weight of the crucible powder, i.e., the source of thallium oxide and lead oxide, then growth of the 1234 phase and especially the 1223 phase is favored. Outside this range growth of the 1212 phase is favored. A preferred source of thallium oxide and lead oxide is 40–70 wt % Tl$_{0.5}$Pb$_{0.5}$Sr$_2$Ca$_2$Cu$_3$O$_9$ and 60–30 wt % Tl$_2$O$_3$. Especially preferred is 50 wt % Tl$_{0.5}$Pb$_{0.5}$Sr$_2$Ca$_2$Cu$_3$O$_9$ and 50 wt % Tl$_2$O$_3$. When the lead content in the crucible is less than about 7% of the total weight of the crucible powder then the growth of the 1223 phase is discouraged. This is evident in the case of the preferred annealing conditions where a powder mixture of approximately 50% Tl$_2$O$_3$ and 50% Tl$_{0.5}$Pb$_{0.5}$Sr$_2$Ca$_2$Cu$_3$O$_9$ by weight is used. After completing an annealing run the powder remaining in the crucible is not only depleted of thallium oxide, but also lead oxide has been lost from the crucible yielding a lead deficient powder. A subsequent anneal using this same powder plus an addition of Tl$_2$O$_3$ corresponding approximately to the total amount of weight loss from the crucible will not yield an annealed film with the desired amount of 1223 phase obtained when a fresh charge of approximately 50% Tl$_2$O$_3$ and 50% Tl$_{0.5}$Pb$_{0.5}$Sr$_2$Ca$_2$Cu$_3$O$_9$ is used. The lead deficient powder from an annealing run can be restored to the desired lead content level by addition of lead oxide.

Exposing a sputtered film to an atmosphere having above about 25% relative humidity or annealing a film in an atmosphere having above about 25% relative humidity significantly increases the amount of the 1212 phase formed relative to the 1223.

Films made by this process exhibit a controllable range of superconductivity transition temperatures from approximately 50 K to over 120 K. The superconductivity transition temperature $T_c$ is defined herein as the onset temperature where the resonant frequency in the eddy current measurement increases as the temperature is lowered. Increasing the proportion of the lower $T_c$ 1212 phase and nonsuperconducting oxide phases decreases this film transition temperature whereas an increase in the proportion of the higher $T_c$ 1223 phase increases the film transition temperature. Combinations of all of the processing variables can be selected to yield a continuous range of transition temperatures as described above for control of the ratio of the superconducting phases in the films. For example, choice of an MgO substrate and short annealing periods at 865° C. and below will yield a film which exhibits an eddy current transition at approximately 25 MHz of about 50 K. Choice of a LaAlO$_3$ substrate and a relatively long annealing period of 16 hours at 865° C. in an atmosphere with low relative humidity will result in eddy current transition at approximately 25 MHz of about 120 K. These films exhibit reduced surface resistance in the superconducting state as exhibited by measurements up to 35 GHz and power levels above 1 milliwatt. These films also exhibit excellent properties in the presence of applied magnetic fields and exceed those of high quality Tl—Ba—Ca—Cu—O and Bi—Sr—Ca—Cu—O films. For example, at a field of 300 oersted applied normal to the film surface, the flux exclusion is decreased by approximately 12% at operating temperatures above 115 K. The X'' peak is shifted downward by approximately 4 K.

Films made by the process of this invention can be fabricated into devices such as resonators, delay lines, filters and other passive devices and also combined with semiconductor materials to produce active devices operating at cryogenic temperatures exhibiting very high quality factors, narrow bandwidths, low noise and very little dispersion giving very precise frequency selectivity. During the device fabrication process these films exhibit excellent chemical and physical ruggedness to various lithographic processes including the use of positive and negative photoresists, lift-off techniques, solvents and cleaning methods. Crystalline films and devices made from Tl—Pb—Sr—Ca—Cu—O show no apparent degradation upon repeated exposure to ambient atmosphere. Reactive ion beam etching has proven to be an extraordinarily successful method of patterning these films to obtain very fine line widths and excellent feature definition. Devices can be designed in microstrip, stripline and coplanar arrangements and result in excellent performance. Very low resistance normal metal to ceramic superconducting contacts can be made to devices by physical deposition of gold and silver. In addition, the normal state resistance of the Tl—Pb—Sr—Ca—Cu—O films has been observed to be low enough to facilitate coupling of radiofrequency and microwave signals with little or no metallization. Devices can be packaged for good thermal conduction and low losses in gold plated copper packages which can be hermetically sealed and passivated. In addition, devices can be packaged in packages where the coefficient of thermal expansion CTE is matched to the substrate material CTE. This has the advantage of yielding a packaged device with very tight internal tolerances. Better thermal conduction and vibration resistance are major advantages of a tight package and these features improve the overall ruggedness of the device for harsh environments such as aeronautical and space applications.

EXAMPLES OF THE INVENTION

Example 1

A three inch diameter ¼ inch (0.64 cm) thick oxide sputtering target containing an atomic ratio of Pb:Sr:Ca:Cu of 0.5:2:2:3 was prepared by mixing 35.6 g of CuO, 31.0 g of SrO, 16.7 g of CaO and 16.7 g of PbO and shaking these materials together in a sealed container. The powders were then ground in a mortar and pestle and placed in an alumina crucible and heated to 800° C. for 6 hours in air. The sintered powders were then ground in a mortar and pestle and pressed in a die at 30 tons per square inch at a temperature of 400° C. for one hour. Off-axis rf magnetron sputtering was performed using 65 watts power with the target located 1½ inches above the substrate. The sputtering gas was argon and the pressure was 5 mtorr (0.7 Pa). A pseudo-cubic (100) face of lanthanum aluminate, $LaAlO_3$, substrate was coated with an amorphous film 1.2 $\mu$m thick. For convenience, in this and other Examples, 16 substrates were coated at a time.

Two 12×12 mm square films prepared as described above were placed on a platinum screen within an alumina crucible. Powder consisting of 0.7341 grams of $Tl_{0.5}Pb_{0.5}Sr_2Ca_2Cu_3O_9$ powder and 0.6545 grams of $Tl_2O_3$ powder were intimately mixed and placed in the bottom of the crucible. The crucible was covered with gold foil and an alumina lid placed on top of the foil. The crucible was placed in a furnace and the temperature was increased to 450° C. at the maximum rate of the furnace (an average of about 20° C./minute), then to 730° C. at a rate of 20° C./minute, then to 810° C. at a rate of 10° C./minute, and finally to 865° C. at a rate of 5° C./minute. The temperature was maintained at 865° C. for 16 hours in an ambient atmosphere at 1032 mbar ($1.032 \times 10^5$ Pa) and 21% relative humidity. The temperature was lowered to 700° C. at a rate of 6° C./minute, the furnace turned off and the films allowed to furnace cool to ambient temperature, about 20° C.

The films exhibited approximately equal amounts of c-axis oriented $Tl_{0.5}Pb_{0.5}Sr_2Ca_2Cu_3O_9$ and $Tl_{0.5}Pb_{0.5}Sr_2CaCu_2O_7$ and a significant amount of c-axis oriented $Tl_{0.5}Pb_{0.5}Sr_2Ca_3Cu_4O_{11}$ phase as determined by X-ray diffraction. Zero resistance was observed at approximately 124–126 K with an onset temperature as high as 127 K. These transitions were confirmed by flux exclusion and ac susceptibility measurements.

Measurements at 35 GHz were made by an end wall cavity replacement method on the TE011 mode. The superconducting oxide film forms one end of a cylindrical microwave cavity. Both films were found to be superconducting below approximately 120 K. The surface resistance is calculated from the relative unloaded Q factors of a copper cavity as a calibration and of one end of the cavity replaced by a superconducting oxide film. At approximately 80 K with 1 milliwatt of input power the surface resistance of the superconducting oxide films were one-third that of copper.

The films exhibit a high magnetic field stability. A field of 300 oersted applied normal to the film surface reduced the flux exclusion by only 12% and shifted the X" peak in the ac susceptibility curve only 4 K lower.

Example 2

A four inch diameter oxide target ¼ inch thick containing an atomic ratio of Pb:Sr:Ca:Cu of 0.35:3.4:2:3 was prepared by mixing 32.0 grams of CuO, 47.8 grams of SrO, 15.0 grams of CaO and 11.5 grams of PbO and shaking these materials together in a sealed container. A 76.6 gram portion of this powder was then pressed in a die at 30 tons per square inch for 30 seconds at ambient temperature. Dc magnetron sputtering was performed using 225 milliamps with the target located approximately five inches below the substrate. The sputtering gas was argon and the pressure was 5 mtorr (0.7 Pa). The (100) face of a magnesium oxide substrate, 1cm×1cm, was coated with an amorphous film 1.2 $\mu$m thick.

One film was annealed as in Example 1 except that the bottom of the crucible contained 1.6 grams of a crushed $Tl_{0.5}Pb_{0.5}Sr_2Ca_2Cu_3O_9$ pellet which had been annealed in a thallium rich environment and 0.0732 grams of $Tl_2O_3$ was added. Annealing a previously used pellet in a thallium rich environment consists of repeated exposure of the pellet to thallium oxide at temperatures above 850° C. for a total time of preferably at least 6–8 hours to insure that the material has sufficient thallium. Films were annealed at a peak temperature of 865° C. for 15 minutes while flowing argon and oxygen was introduced around the crucible. Except for the time for which the film was maintained at 865° C. the temperature program for heating and cooling was essentially the same as that used in Example 1. The relative room humidity level was 63% and the ambient atmospheric pressure was 1025 mbar ($1.025 \times 10^5$ Pa).

The films exhibited only the $Tl_{0.5}Pb_{0.5}Sr_2CaCu_2O_7$ phase as determined by an X-ray diffraction scan of the surface. Eddy current measurements at approximately 25 MHz exhibit a broad transition starting at approximately 50 K. Scanning electron microscope images showed that the grains in the film were less than 10 $\mu$m in size.

Example 3

Dc magnetron sputtering was performed essentially as described in Example 2 except that an oxide target containing an atomic ratio of Tl:Pb:Sr:Ca:Cu of 0.5:0.5:2:2:3 was used. This target was purchased from Superconductor Components, Inc. The (100) face of a magnesium oxide substrate, 1cm×1cm, was coated with an amorphous film 1.2 $\mu$m thick.

Annealing was done in a manner essentially the same as that described in Example 2 except that the peak annealing temperature was 920° C., the time for which this temperature was maintained was 10 minutes, the ambient pressure was 1028 mbar ($1,028 \times 10^5$ Pa) and the relative humidity was 58%.

The resulting films exhibited essentially only c-axis oriented 1212 phase as determined by X-ray diffraction measurements. The films had a surface resistance of 2 kohms at room temperature as determined by a two-point ohm-meter measurement.

Example 4

Dc magnetron sputtering was performed essentially as described in Example 2 except that an oxide target containing an atomic ratio of Tl:Pb:Sr:Ca:Cu of 1:1:2:2:3 was used. This target was purchased from Superconductor Components, Inc. The (100) face of a magnesium oxide substrate, 1 cm×1cm, was coated with an amorphous film 1.2 μm thick.

Annealing was done in a manner essentially the same as that described in Example 2 except that the bottom of the crucible contained about 1.6 g of a crushed 1223 pellet which had been annealed in a thallium rich environment as described in Example 2 and 0.1526 grams of $Tl_2O_3$. Heating conditions were essentially the same as those described in Example 1 except that the peak annealing temperature was 920° C., the time for which this temperature was maintained was 10 minutes, the ambient pressure was 1012 mbar ($1,012 \times 10^5$ Pa) and the relative humidity was 50%.

The resulting film exhibited predominately c-axis oriented 1212 phase with some c-axis oriented 1223 present. There was also a significant amount of $Ca_2PbO_4$ present. The film exhibited a surface resistance of 3.6 Mohms at room temperature as determined by a two-point ohm-meter measurement.

Example 5

Off-axis rf magnetron sputtering was performed essentially as described in Example 1 and the same three inch diameter oxide target containing Pb:Sr:Ca:Cu in the ratio of 0.5:2:2:3 used in Example 1 was used.

Two 12 mm×12 mm films on lanthanum aluminate were annealed as in Example 2 except that the bottom of the crucible contained 1.61 g of a crushed 1223 pellet which had been annealed in a thallium rich environment as described in Example 2 and 0.169 g of $Tl_2O_3$.

Annealing conditions were essentially the same as those described in Example 2 except that the time for which the film was maintained at 865° C. was 16 hours, the ambient pressure was 1026 mbar ($1.026 \times 105$ Pa) and the relative humidity was 88%.

As determined by X-ray diffraction measurements the films exhibited primarily c-axis oriented 1223 and 1212 phases and a trace of 1234 phase with the 1212 phase being the dominant. The films exhibited a surface resistance of approximately 30 ohms at room temperature as determined by a two-point ohm-meter measurement. An eddy current measurement at 25 MHz exhibited a single transition at approximately 90 K.

Example 6

A microstrip resonator with a resonance frequency of 5 GHz was prepared as follows. One film prepared in Example 5 was coated with a 0.3 micron thick layer of poly(methyl methacrylate), PMMA which was spun on and then heated at 170° C. for 30 minutes. A 3 μm thick layer of Shipley 1400-36 photoresist, a novolac resin doped with diazoquinone, 2-ethoxyethyl acetate, n-butyl acetate and xylene, was then applied and heated at 90° C. for 15 minutes. A mask was applied to the film and exposed to 365 nm wavelength radiation at 30 mJ/cm². The films were then immersed in Shipley MF312-CD27, tetramethyl ammonium hydroxide and water, developer for 30 seconds in order to remove the portion of the photoresist layer which had been exposed to the radiation. The films were ion milled at 0.1 mtorr (0.01Pa) pressure for about 3 hours with a 120 mW/cm² beam of argon ions. This beam was effective in removing the exposed superconducting film to reveal the device image on the substrate but did not remove the unexposed portion of the photoresist and the PMMA and film beneath it. The sample was then exposed to an oxygen plasma for 70 minutes at 20 watts/cm² to remove the remaining photoresist and PMMA. Silver contacts were then applied to superconducting oxide pads at either end of the device. A ground plane comprised of a superconducting oxide film of Tl—Ba—Ca—Cu—O with silver contacts at either end was fabricated by masking the film and dc sputtering silver directly onto opposite ends of the film. Any superconductor, e.g. $YBa_2Cu_3O_7$, could be used. Both ground plane and device were packaged in a gold plated copper cavity. Waveguide connections were made to each pad of the device through gold pins. The ground plane silver contacts were placed in intimate contact with the cavity. The ground plane and device were oriented in a microstrip fashion with the lanthanum aluminate substrate dielectric material of the device separating the ground plane surface from the device. The microwave package was filled with neon and hermetically sealed with indium. Microwave energy was capacitively coupled to the device's superconducting strip when it was cooled cryogenically. At 70 K the device resonated at 5 GHz with a Q of approximately 1300 with an insertion loss of approximately −65 dB at an input power of 1 milliwatt. The Q is a figure of merit which is inversely proportional to the amount of energy lost per cycle by a resonant structure. It is the ratio of energy stored to the energy dissipated. The insertion loss is the ratio of the input power to the output power.

Example 7

Off-axis rf magnetron sputtering was performed essentially as described in Example 1 and the same three inch diameter oxide target containing Pb:Sr:Ca:Cu in the ratio of 0.5:2:2:3 used in Example 1 was used.

Two 12 mm×12 mm films on MgO were annealed as in Example 5 except that the bottom of the crucible contained 1.61 g of a crushed 1223 pellet which had been annealed in a thallium rich environment as described in Example 2 and 0.0809 g of $Tl_2O_3$.

Annealing conditions were essentially the same as those described in Example 1 except that the peak annealing temperature was 900° C. and the time for which the film was maintained at 900° C. was 15 minutes.

The films exhibited predominantly c-axis oriented 1223 and 1212 phases. The dominant phase was 1212. SEM, scanning electron microscopy, imaging revealed grain sizes to be over 50 μm.

Example 8

A three inch diameter ¼ inch (0.64 cm) thick oxide sputtering target containing an atomic ratio of Pb:Sr:Ca:Cu of 0.5:2:2:3 was prepared by mixing 85.6 g of CuO, 74.3 g of SrO, 40.2 g of CaO and 40.0 g of PbO and shaking these materials together in a sealed container. The powders were placed in an alumina crucible and heated to 800° C. for 6 hours in air. The sintered powders were then ground in a mortar and pestle and pressed in a die at 30 tons per square inch at a temperature of 400° C. for one hour.

The pressed target was then placed in a rf magnetron sputtering gun and installed in a vacuum sputtering chamber. Preliminary films were sputtered on silicon wafers at 65 watts power and 8 milltorr (1.1 Pa) argon pressure yielding films less than 100 nm thick. These films were analyzed by means of Rutherford Backscattering to determine the stoichiometry of Pb:Sr:Ca:Cu which was found to be 0.47(±0.01):2.04(±0.01):2.05(±0.02):2.95(±0.02).

The position of the substrates in the sputtering chamber was measured relative to the intersection of the center line of the substrate holder, i.e., the line perpendicular to the substrate holder and passing through its center, and the centerline of the sputtering target, i.e., the line perpendicular to the sputtering target and passing through its center, this intersection serving as the origin of the coordinate system used to describe the position of the substrate. These two centerlines were perpendicular in the configuration used in this Example. Taking the sputtering target centerline as the x-axis and the substrate holder centerline as the z-axis, the relative positions of the substrates can be referenced to this coordinate system. The substrates position was x=4.75 inches and z=3 inches. The substrates were rotated about the x-axis during deposition.

Four 1 inch (2.5 cm) square lanthanum aluminate substrates were coated using the off-axis rf sputtering configuration described above at 100 watts power and 5 mtorr (0.7 Pa) argon pressure. The pseudo-cubic (100) face of each lanthanum aluminate substrate was coated with an amorphous film 1 micron thick. These films had excellent mirror-like surfaces.

Powders consisting of 0.7623 grams of $Tl_{0.5}Pb_{0.5}Sr_2Ca_3Cu_4$ powder and 0.3610 grams of $Tl_2O_3$ powder were placed in the bottom of an alumina crucible and intimately mixed. One lanthanum aluminate substrate with the sputtered amorphous film was placed in the crucible on a platinum screen. The crucible was covered with gold foil, and an alumina lid was placed on top of the foil. The crucible was placed in a furnace and the temperature was increased to 450° C. at the maximum rate of the furnace (an average of about 20° C./minute, then to 730° C. at a rate of 20° C./minute, then to 810° C. at a rate of 10° C./minute, and finally to 865° C. at a rate of 5° C./minute. The temperature was maintained at 865° C. for 16 hours in an ambient atmosphere at 1032 mbar ($1.032 \times 10^5$ Pa) and 78% relative humidity. The temperature was lowered to 700° C. at a rate of 6° C./minute, the furnace turned off and the films allowed to furnace cool to ambient temperature, about 20° C.

The resulting film was very smooth and exhibited a glossy surface free of major defects. As determined by X-ray diffraction, the film exhibited predominantly c-axis oriented 1212 $Tl_{0.5}Pb_{0.5}Sr_2CaCu_2O_7$ and with a minor amount of c-axis oriented 1223 $Tl_{0.5}Pb_{0.5}Sr_2Ca_2Cu_3O_9$. Traces of 1234 $Tl_{0.5}Pb_{0.5}Sr_2Ca_3Cu_4O_{11}$ and 1201 $Tl_{0.5}Pb_{0.5}Sr_2CuO_5$ were also present. The phase $Ca_2PbO_4$ was also found to be a very minor component.

An eddy current measurement at 25 MHz exhibited a single transition at approximately 88 K.

Measurements at 20 GHz were made by an end wall cavity replacement method on the TE011 mode. The surface resistance is calculated from the relative unloaded Q factors of a copper cavity as a calibration and of one end of the cavity replaced by a superconducting oxide film. At approximately 50 K with 1 milliwatt of input power the surface resistance of the superconducting oxide film was approximately six times lower than copper.

What is claimed is:

1. A superconducting Tl—Pb—Sr—Ca—Cu—O thin film comprising at least one phase of the formula $Tl_{0.5}Pb_{0.5}Sr_2Ca_{1+n}Cu_{2+n}O_{7+2n}$ where n=0, 1 or 2, prepared by the process comprising
   (a) sputtering an oxide film onto a dielectric substrate from a target formed by
      (1) heating a mixture of Pb, Sr, Ca, and Cu oxides wherein the atomic ratio of Pb:Sr:Ca:Cu is b:c:d:e, wherein b is about 0.5, c is about 2, d is about 2, e is about 3, and
      (2) compressing and heating said mixture,
   (b) placing said substrate having said oxide film thereon and a source of thallium oxide and lead oxide in an inert container with an oxygen-containing atmosphere, the amount of thallium and lead contained in said source being at least 100 times the amount of thallium and lead necessary to convert said oxide film to $Tl_{0.5}Pb_{0.5}Sr_2Ca_{1+n}Cu_{2+n}O_{7+2n}$,
   (c) heating said container to a temperature of from about 850° C. to about 950° C. and maintaining said temperature for at least about 10 minutes, and
   (d) cooling said container and yielding the superconducting Tl—Pb—Sr—Ca—Cu—O thin film on said dielectric substrate.

2. A superconducting Tl—Pb—Sr—Ca—Cu—O thin film phase formula $Cu_3O_9$, prepared by the process comprising
   (a) sputtering an oxide film onto a dielectric substrate from a target formed by
      (1) heating a mixture of Pb, Sr, Ca, and Cu oxides wherein the atomic ratio of Pb:Sr:Ca:Cu is b:c:d:e, wherein b is about 0.5, c is about 2, d is about 2, and e is about 3, and
      (2) compressing and heating said mixture, wherein said dielectric substrate is selected from the group consisting of $LaAlO_3$, $NdGaO_3$ and $LaGaO_3$;
   (b) placing said substrate having said oxide film thereon and a source of thallium oxide and lead oxide in an inert container with an oxygen-containing atmosphere having a relative humidity greater than about 25%, said source of thallium oxide and lead oxide consisting essentially of 40–70 wt % $Tl_{0.5}Pb_{0.5}Sr_2Ca_2Cu_3O_9$ and 60–30 wt % $Tl_2O_3$ and the amount of thallium and lead contained in said source being at least 100 times the amount of thallium and lead needed to convert said oxide film to $Tl_{0.5}Pb_{0.5}Sr_2Ca_2Cu_3O_9$;
   (c) heating said container to a temperature of from about 865° C. to about 920° C. and maintaining said temperature for at least about 30 minutes; and
   (d) cooling said container and yielding the superconducting Tl—Pb—Sr—Ca—Cu—O thin film on said dielectric substrate.

3. A superconducting Tl—Pb—Sr—Ca—Cu—O thin film comprising a phase of the formula $Tl_{0.5}Pb_{0.5}Sr_2CaCu_2O_7$, prepared by the process comprising
   (a) sputtering an oxide film onto a dielectric substrate from a target formed by
      (1) heating a mixture of Pb, Sr, Ca, and Cu oxides wherein the atomic ratio of Pb:Sr:Ca:Cu is b:c:d:e, wherein b is about 0.5, c is about 2, d is about 2, and e is about 3, and
      (2) compressing and heating said mixture;
   (b) placing said substrate having said oxide film thereon and a source of thallium oxide and lead oxide in an inert container with an oxygen-containing atmosphere having a relative humidity greater than about 25%, the amount of thallium and lead contained in said source being at least 100 times the amount of thallium and lead needed to convert said oxide film to $Tl_{0.5}Pb_{0.5}Sr_2CaCu_2O_7$;
   (c) heating said container to a temperature of from about 850° C. to about 865° C. or from about 920° C. to about 950° C. and maintaining said temperature for less than about 1 hour; and
   (d) cooling said container and yielding the superconducting Tl—Pb—Sr—Ca—Cu—O thin film on said dielectric substrate.

* * * * *